US 9,425,265 B2

(12) United States Patent
Van Brunt et al.

(10) Patent No.: US 9,425,265 B2
(45) Date of Patent: Aug. 23, 2016

(54) EDGE TERMINATION TECHNIQUE FOR HIGH VOLTAGE POWER DEVICES HAVING A NEGATIVE FEATURE FOR AN IMPROVED EDGE TERMINATION STRUCTURE

(71) Applicant: Cree, Inc., Durham, NC (US)

(72) Inventors: Edward Robert Van Brunt, Raleigh, NC (US); Vipindas Pala, Morrisville, NC (US); Lin Cheng, Chapel Hill, NC (US); Anant Kumar Agarwal, Arlington, VA (US)

(73) Assignee: Cree, Inc., Durham, NC (US)

( * ) Notice: Subject to any disclaimer, the term of this patent is extended or adjusted under 35 U.S.C. 154(b) by 61 days.

(21) Appl. No.: 13/968,740

(22) Filed: Aug. 16, 2013

(65) Prior Publication Data

US 2015/0048489 A1 Feb. 19, 2015

(51) Int. Cl.
*H01L 29/36* (2006.01)
*H01L 21/322* (2006.01)
(Continued)

(52) U.S. Cl.
CPC ............ *H01L 29/36* (2013.01); *H01L 21/0475* (2013.01); *H01L 21/322* (2013.01);
(Continued)

(58) Field of Classification Search
CPC ............ H01L 29/0615; H01L 29/0661; H01L 29/732; H01L 29/7395; H01L 29/74; H01L 29/861; H01L 29/7811; H01L 29/7823
USPC .......... 257/170, 171, 409, 484, 605, E29.012, 257/104
See application file for complete search history.

(56) References Cited

U.S. PATENT DOCUMENTS 4,648,174 A 3/1987 Temple et al.
4,672,738 A * 6/1987 Stengl et al. .................. 438/514
(Continued)

FOREIGN PATENT DOCUMENTS

JP 2009111320 A 5/2009
WO 9708754 A2 3/1997
(Continued)

OTHER PUBLICATIONS

Stengl, R. et al., "Variation of Lateral Doping—A New Concept to Avoid High Voltage Breakdown of Planar Junctions," 1985 International Electron Devices Meeting, vol. 31, 1985, pp. 154-157.
(Continued)

*Primary Examiner* — Anh Mai
(74) *Attorney, Agent, or Firm* — Anthony J. Josephson

(57) ABSTRACT

Embodiments of a semiconductor die having a semiconductor device implemented on the semiconductor die and an edge termination structure around a periphery of the semiconductor device and methods of fabricating the same are disclosed. In one embodiment, a semiconductor die includes a semiconductor device and an edge termination structure around a periphery of the semiconductor device, where the edge termination structure includes negative features (e.g., trenches and/or divots) that vary dose in a corresponding edge termination region to approximate a desired dose profile. In one embodiment, the desired dose profile is a substantially decreasing or substantially linearly decreasing dose from an edge of a main junction of the semiconductor device to an edge of the edge termination region. In this manner, electric field crowding at the edge of the main junction of the semiconductor device is substantially reduced, which in turn substantially improves a break-down voltage of the semiconductor device.

14 Claims, 13 Drawing Sheets

(51) Int. Cl.
| | |
|---|---|
| H01L 29/78 | (2006.01) |
| H01L 29/66 | (2006.01) |
| H01L 29/861 | (2006.01) |
| H01L 29/06 | (2006.01) |
| H01L 21/04 | (2006.01) |
| H01L 29/732 | (2006.01) |
| H01L 29/745 | (2006.01) |
| H01L 29/749 | (2006.01) |
| H01L 29/872 | (2006.01) |
| H01L 29/16 | (2006.01) |

(52) U.S. Cl.
CPC ........ *H01L29/0615* (2013.01); *H01L 29/0661* (2013.01); *H01L 29/6606* (2013.01); *H01L 29/7811* (2013.01); *H01L 29/7823* (2013.01); *H01L 29/861* (2013.01); *H01L 29/1608* (2013.01); *H01L 29/66068* (2013.01); *H01L 29/732* (2013.01); *H01L 29/749* (2013.01); *H01L 29/7455* (2013.01); *H01L 29/872* (2013.01)

(56) References Cited

U.S. PATENT DOCUMENTS

| | | | |
|---|---|---|---|
| 5,449,925 | A | 9/1995 | Baliga et al. |
| 5,552,625 | A * | 9/1996 | Murakami et al. ............. 257/409 |
| 5,914,500 | A | 6/1999 | Bakowski et al. |
| 5,967,795 | A * | 10/1999 | Bakowsky et al. ............. 438/494 |
| 5,970,324 | A | 10/1999 | Driscoll |
| 5,977,605 | A | 11/1999 | Bakowsky et al. |
| 6,469,359 | B2 * | 10/2002 | Bakowski et al. ............. 257/487 |
| 7,345,310 | B2 | 3/2008 | Agarwal et al. |
| 7,372,087 | B2 | 5/2008 | Chen et al. |
| 7,498,651 | B2 | 3/2009 | Van Zeghbroeck |
| 7,759,186 | B2 * | 7/2010 | Imhoff et al. ................. 438/212 |
| 7,838,377 | B2 | 11/2010 | Zhang et al. |
| 7,906,796 | B2 | 3/2011 | Mochizuki et al. |
| 8,362,586 | B2 * | 1/2013 | Hatakeyama ................. 257/484 |
| 8,460,977 | B2 | 6/2013 | Zhang et al. |
| 2007/0080422 | A1 | 4/2007 | Falck et al. |
| 2007/0145378 | A1 | 6/2007 | Agarwal et al. |
| 2009/0134402 | A1 | 5/2009 | Yatsuo et al. |
| 2010/0055882 | A1 | 3/2010 | Imhoff et al. |
| 2012/0218796 | A1 * | 8/2012 | Okamoto ...................... 363/126 |
| 2012/0292636 | A1 | 11/2012 | Zhang et al. |
| 2013/0020611 | A1 | 1/2013 | Gumaelius |
| 2015/0021742 | A1 * | 1/2015 | Van Brunt et al. ............. 257/618 |

FOREIGN PATENT DOCUMENTS

| | | |
|---|---|---|
| WO | 0249114 A2 | 6/2002 |
| WO | 2007143008 A2 | 12/2007 |
| WO | 2011120979 A1 | 10/2011 |

OTHER PUBLICATIONS

International Search Report and Written Opinion for PCT/US2014/041680, mailed Sep. 9, 2014, 10 pages.
Agarwal, A. et al., "Prospects of bipolar power devices in silicon carbide," 34th Annual Conference of Industrial Electronics, Nov. 10, 2008, pp. 2879-2884.
Baliga, B. J., "Fundamentals of Power Semiconductor Devices", Springer Science, 2008, pp. 653; 208; 211.
Ghandi, R. et al., "High-Voltage 4H-SiC PiN Diodes With Etched Junction Termination Extension," IEEE Electron Device Letters, vol. 30, No. 11, Nov. 2009, pp. 1170-1172.
Hiyoshi, T. et al., "Bevel Mesa Combined with Implanted Junction Termination Structure for 10 kV SiC PiN Diodes," Materials Science Forum, vols. 600-603, 2009, pp. 995-998.
Kimoto, Tsunenobu et al., "Enhancement of Carrier Lifetimes in n-Type 4H-SiC Epitaxial Layers by Improved Surface Passivation," Applies Physics Express, vol. 3, Dececmber 10, 2010, 3 pages.
Li, X. et al., "Multistep junction termination extension for SiC power devices," Electronics Letters, vol. 37, No. 6, Mar. 15, 2001, pp. 392-393.
Matsuura, H. et al., "Mechanisms of reduction in hole concentration in Al-doped 4H-SiC by 200 keV electron irradiation," Review, JAEA, Japan Atomic Energy Agency, vol. 2009-041, Dec. 1, 2009, pp. 14.
Yu, H. et al., "An IGBT and MOSFET gated SiC bipolar junction transistor," Conference Record of the 2002 IEEE Industry Applications Conference, vol. 4, Oct. 13-18, 2002, pp. 2609-2613.
Zhang, Q. J. et al., "SiC Super Thyristor Technology Development: Present Status and Future Perspective," 2011 Pulsed Power Conference, Jun. 19-23, 2011, 6 pages.
Zhang, Q. J. et al., "12 kV, 1 cm2 SiC GTO Thyristors with Negative Bevel Termination," presented at ICSCRM 2011, Cleveland, Ohio, USA, Sep. 11-16, 2011, 4 pages.
Invitation to Pay Additional Fees and, Where Applicable, Protest Fee for PCT/US2012/037215 mailed Jul. 20, 2012, 8 pages.
International Search Report and Written Opinion for PCT/US2012/037215 mailed Sep. 25, 2012, 19 pages.
International Preliminary Report on Patentability for PCT/US2012/037215, mailed Nov. 28, 2013, 11 pages.
International Search Report and Written Opinion for PCT/US2013/024740, mailed Jun. 14, 2013, 12 pages.
International Preliminary Report on Patentability for PCT/US20131024740, mailed Aug. 21, 2014, 8 pages.
Office Action of the Intellectual Property Office for Taiwanese Patent Application No. 101117452, mailed Jan. 26, 2015, 16 pages.
Non-Final Office Action for U.S. Appl. No. 13/108,366, mailed Oct. 17, 2012, 6 pages.
Final Office Action for U.S. Appl. No. 13/108,366, mailed Apr. 9, 2013, 9 pages.
Advisory Action for U.S. Appl. No. 13/108,366, mailed Jul. 11, 2013, 8 pages.
Non-Final Office Action for U.S. Appl. No. 13/108,366, mailed Jan. 2, 2014, 9 pages.
Final Office Action for U.S. Appl. No. 13/108,366, mailed Apr. 25, 2014, 11 pages.
Advisory Action for U.S. Appl. No. 13/108,366, mailed Jul. 25, 2014, 9 pages.
Non-Final Office Action for U.S. Appl. No. 13/108,366, mailed Jan. 29, 2015, 14 pages.
Final Office Action and Interview Summary for U.S. Appl. No. 13/108,366, mailed May 15, 2015, 7 pages.
Restriction Requirement for U.S. Appl. No. 13/366,658, mailed Jul. 16, 2013, 5 pages.
Non-Final Office Action for U.S. Appl. No. 13/366,658, mailed Nov. 25, 2013, 7 pages.
Final Office Action for U.S. Appl. No. 13/366,658, mailed Jul. 11, 2014, 10 pages.
Notice of Allowance for U.S. Appl. No. 13/366,658, mailed Jan. 30, 2015, 8 pages.
Notice of Allowance for U.S. Appl. No. 13/366,658, mailed Apr. 16, 2015, 7 pages.
Notice of Allowance and Applicant-Initiated Interview Summary for U.S. Appl. No. 13/108,366, mailed Aug. 4, 2015, 12 pages.
Notice of Allowance for U.S. Appl. No. 13/366,658, mailed Aug. 3, 2015, 7 pages.
Notice of Allowance for U.S. Appl. No. 13/108,366, mailed Nov. 25, 2015, 10 pages.
Notice of Allowance for U.S. Appl. No. 13/366,658, mailed Jan. 15, 2016, 7 pages.
Examination Report for European Patent Application No. 127242253, mailed Dec. 4, 2015, 5 pages.
European Patent Office Communication for European Patent Application No. 127242253, mailed Dec. 10, 2015, 4 pages.
International Preliminary Report on Patentability for International Patent Application No. PCT/US2014/041680, mailed Feb. 25, 2016, 8 pages.

(56) References Cited

OTHER PUBLICATIONS

First Office Action for Chinese Patent Application No. 201280035253.1, issued Jan. 12, 2016, 21 pages.
Office Action for Swiss National Phase Patent Application No. 01183/14, mailed Mar. 24, 2016, 3 pages.
Examination Report for European Patent Application No. 12724225.3, mailed May 12, 2016, 6 pages.
Notice of Reason for Rejection for Japanese Patent Application No. 2014-511405, mailed Mar. 18, 2016, 6 pages.
Notice of Reasons for Rejection for Japanese Patent Application No. 2014-556614, mailed Jun. 14, 2016, 7 pages.

\* cited by examiner

EDGE TERMINATION TECHNIQUE FOR HIGH VOLTAGE POWER DEVICES HAVING A NEGATIVE FEATURE FOR AN IMPROVED EDGE TERMINATION STRUCTURE

GOVERNMENT SUPPORT

This invention was made with government funds under contract number W911 NF-10-2-0038 awarded by the Army. The U.S. Government may have rights in this invention.

FIELD OF THE DISCLOSURE

The present disclosure relates to edge termination for high voltage semiconductor power devices.

BACKGROUND

Silicon Carbide (SiC) is a desirable material for high-power and high-temperature semiconductor devices due to its high breakdown field, high thermal conductivity, and wide bandgap. However, to take advantage of the high breakdown field in a high-voltage device, an efficient edge termination is needed. More specifically, field crowding at the edge of the device results in device breakdown at the edge of the device, which in turn decreases the blocking voltage of the device well below the ideal blocking voltage (i.e., the blocking voltage of the ideal parallel-plane device).

Field crowding has traditionally been addressed using an ion implanted or etched Junction Termination Extension (JTE). More specifically, the JTE includes a thin ion implanted or etched region of a lighter doping than a main junction of the semiconductor device, and the doping type of the JTE is opposite that of a drift layer of the semiconductor device. A typically etched JTE that includes three etched steps is illustrated in FIG. 1. The etched steps progressively reduce a dose (i.e., a doping concentration multiplied by the height dimension) of a corresponding P type layer from a main junction of the semiconductor device to an edge of a corresponding edge termination region. This in turn leads to a decrease in the total electric field towards the edge of the edge termination region. However, due to the etched steps, peaks are present in a lateral, or x, component of the total electric field. These peaks place high stress on dielectrics and packaging materials formed on the surface of the semiconductor device, which can lead to failure of the semiconductor device. Thus, there is a need for an improved edge termination structure.

SUMMARY

Embodiments of a semiconductor die having a semiconductor device implemented on the semiconductor die and an edge termination structure around a periphery of the semiconductor device and methods of fabricating the same are disclosed. In one embodiment, a semiconductor die includes a semiconductor device and an edge termination structure around a periphery of the semiconductor device, where the edge termination structure includes negative features (e.g., trenches and/or divots) that vary dose in a corresponding edge termination region to approximate a desired dose profile. In one embodiment, the desired dose profile is a substantially decreasing or substantially linearly decreasing dose from an edge of a main junction of the semiconductor device to an edge of the edge termination region. In this manner, electric field crowding at the edge of the main junction of the semiconductor device is substantially reduced, which in turn substantially improves a break-down voltage of the semiconductor device.

In one embodiment, the edge termination structure includes one or more negative steps that define two or more concentric starting zones around the periphery of the semiconductor device. Within each starting zone, the edge termination structure includes multiple negative features (e.g., trenches and/or divots) that vary dose in the starting zone according to the desired dose profile. In one embodiment, within each starting zone, the negative features in the starting zone include multiple concentric trenches having increasing widths such that dose substantially linearly decreases within the starting zone. In another embodiment, within each starting zone, the negative features in the starting zone include multiple concentric rings of divots that substantially linearly decrease dose within the starting zone.

In another embodiment, the edge termination structure includes multiple divot rings around a periphery of the semiconductor device in the edge termination region. In one embodiment, widths of the divot rings vary to provide the desired dose profile from the edge of a main junction of the semiconductor device to the edge of the edge termination region.

Those skilled in the art will appreciate the scope of the present disclosure and realize additional aspects thereof after reading the following detailed description of the preferred embodiments in association with the accompanying drawing figures.

BRIEF DESCRIPTION OF THE DRAWING FIGURES

The accompanying drawing figures incorporated in and forming a part of this specification illustrate several aspects of the disclosure, and together with the description serve to explain the principles of the disclosure.

Figure 1:
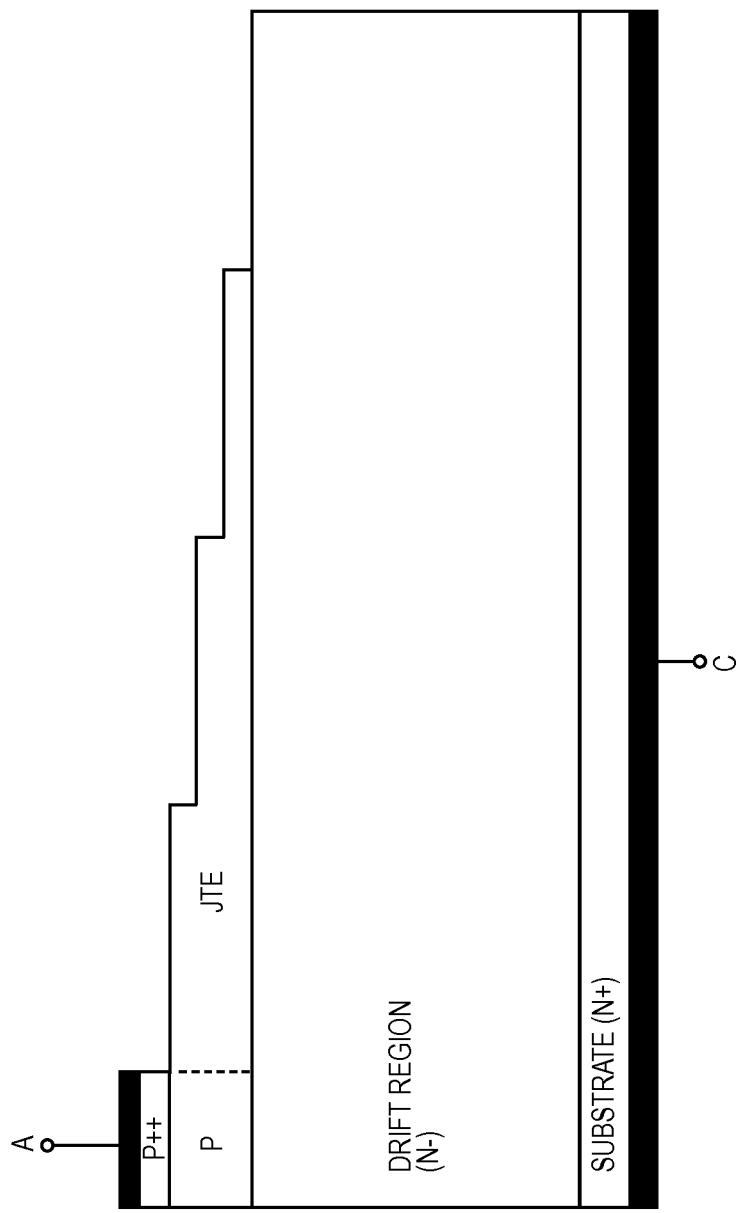
FIG. 1 illustrates a traditional edge termination structure, namely, an etched Junction Termination Extension (JTE)
Figure 3:
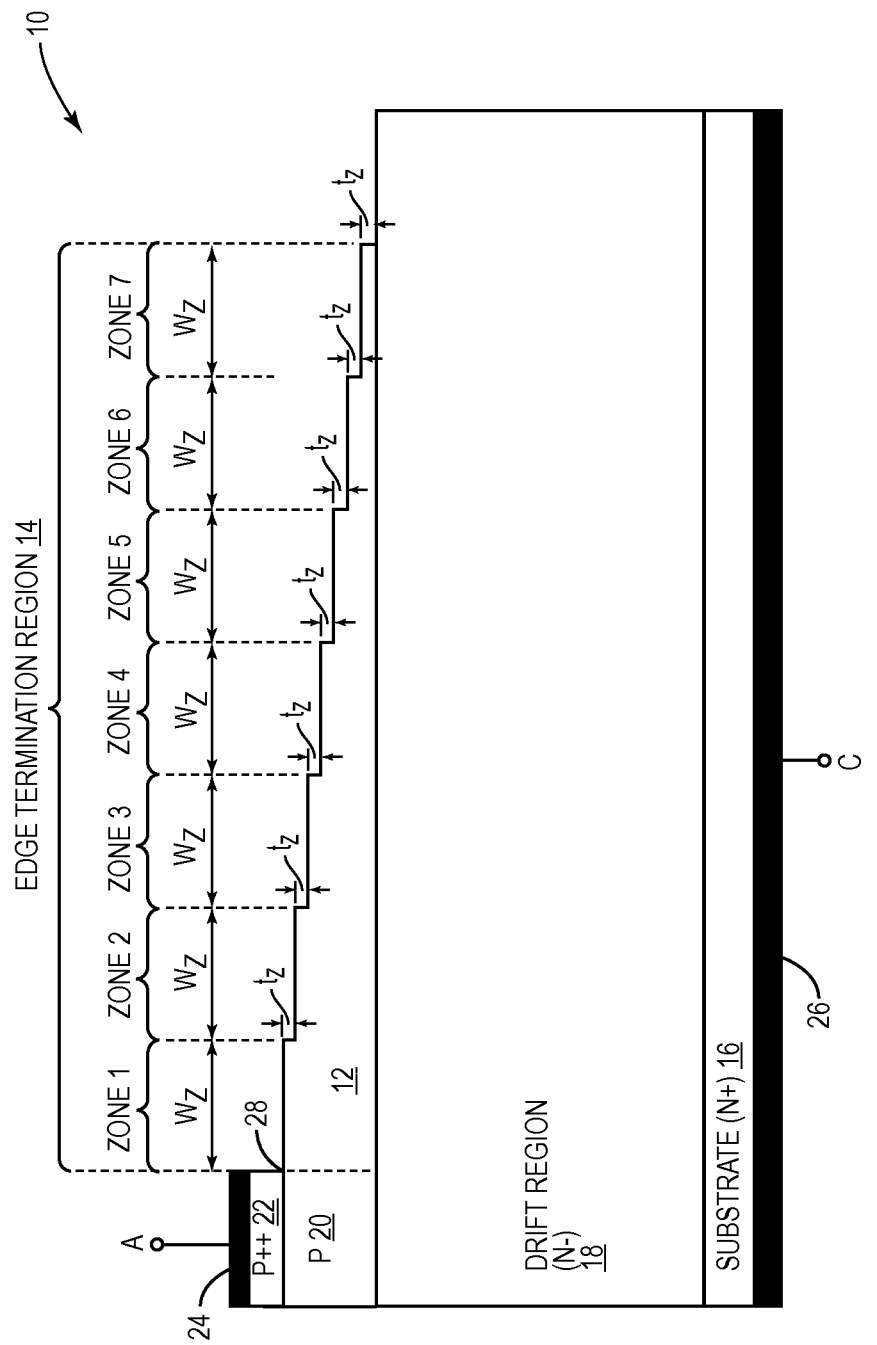
FIG. 3 illustrates a state-of-the-art stepped negative bevel edge termination that approximates the desired dose profile of FIG. 2A and thus the desired electric field profiles of FIG. 2B.
Figure 4:
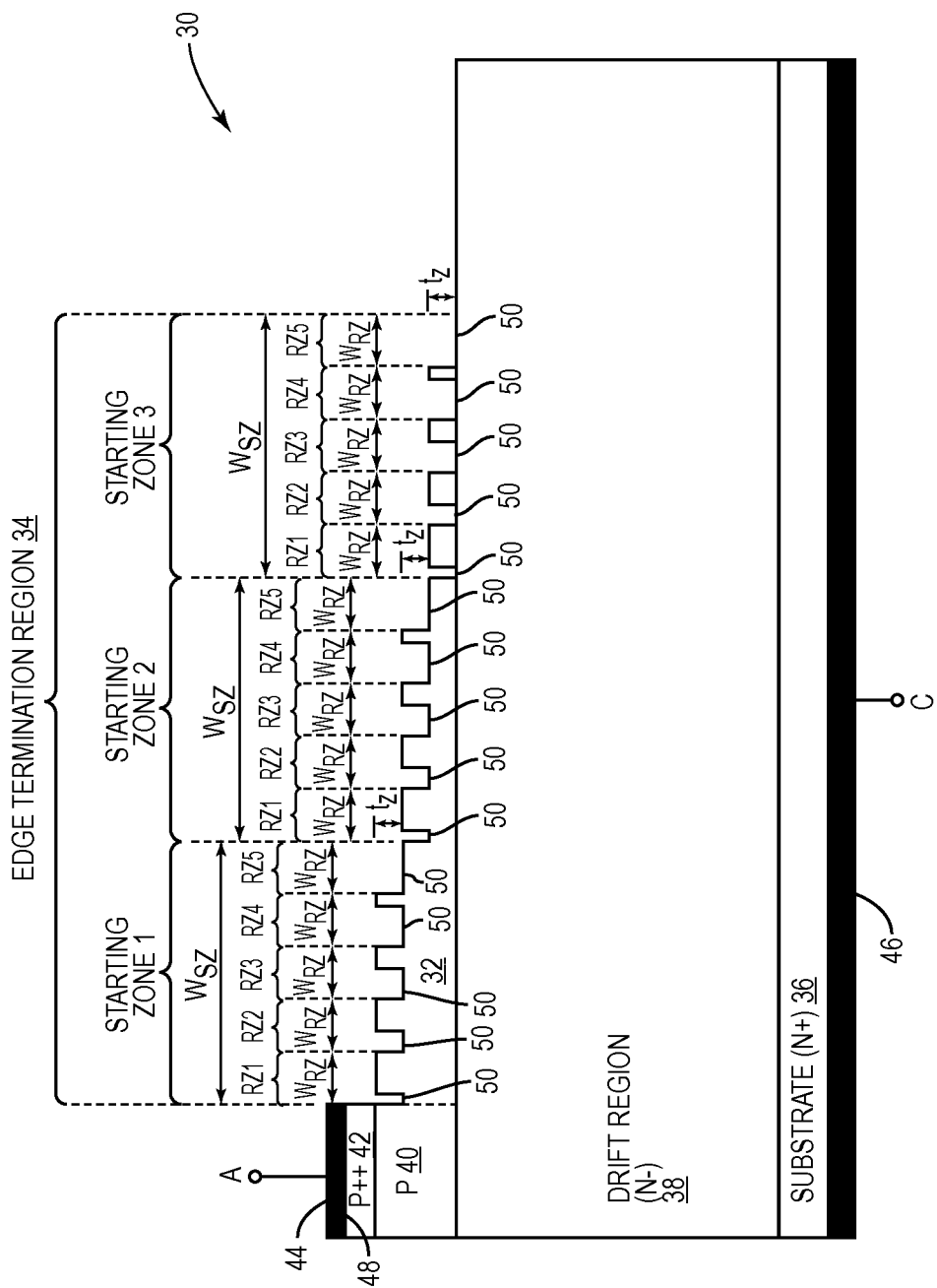
Figure 5A:
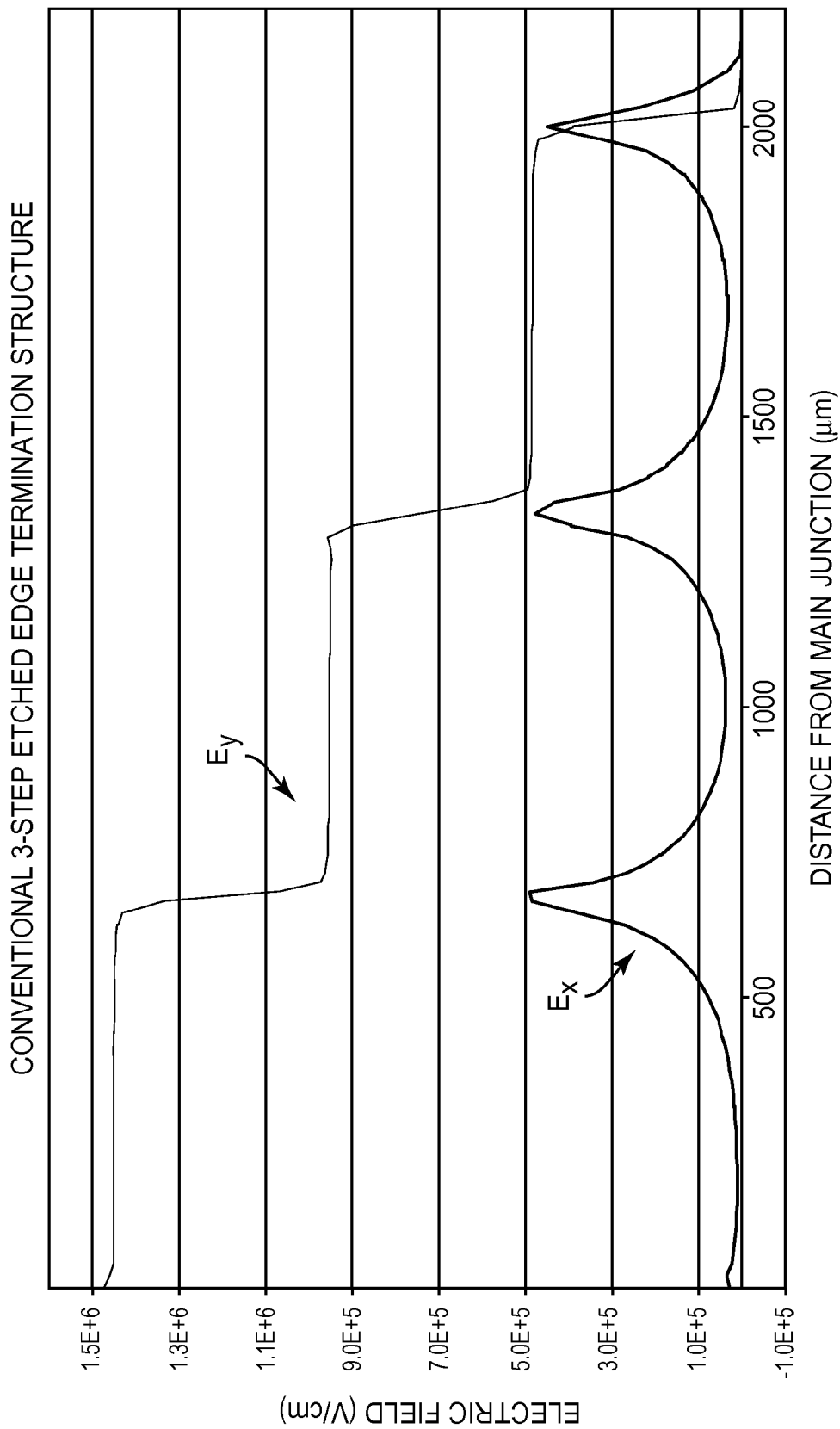
Figure 5B:
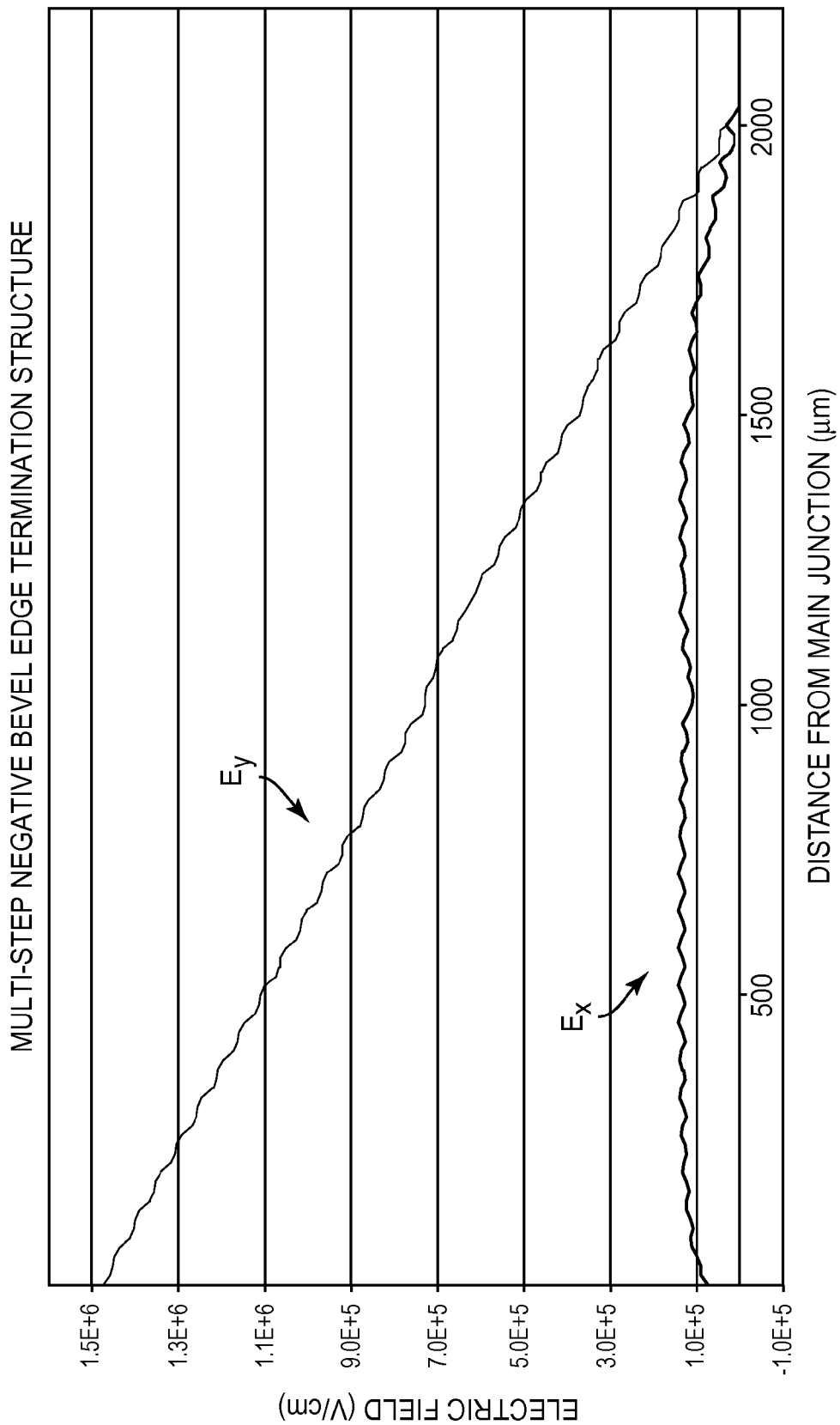
Figure 5C:
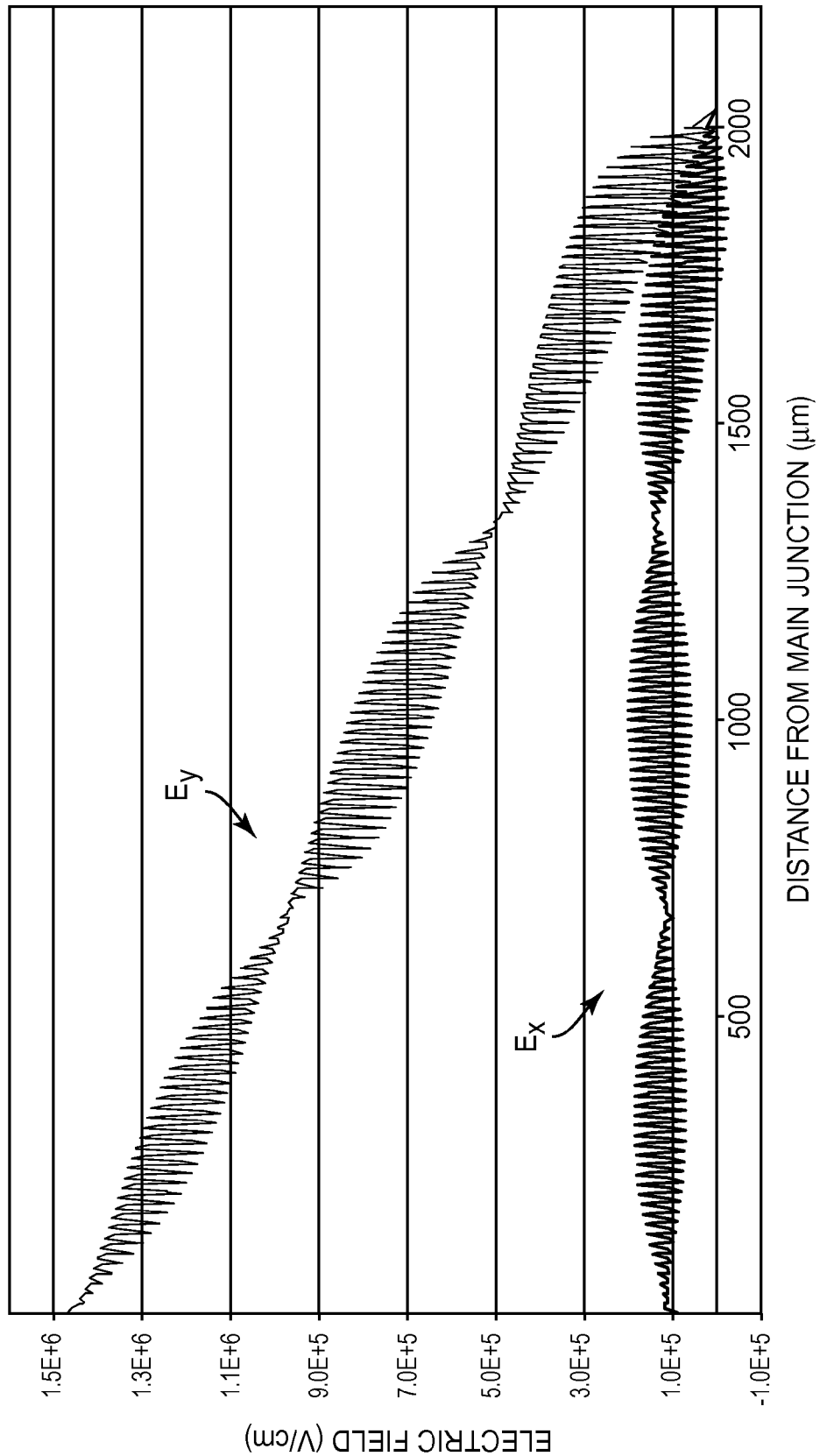
Figure 6:
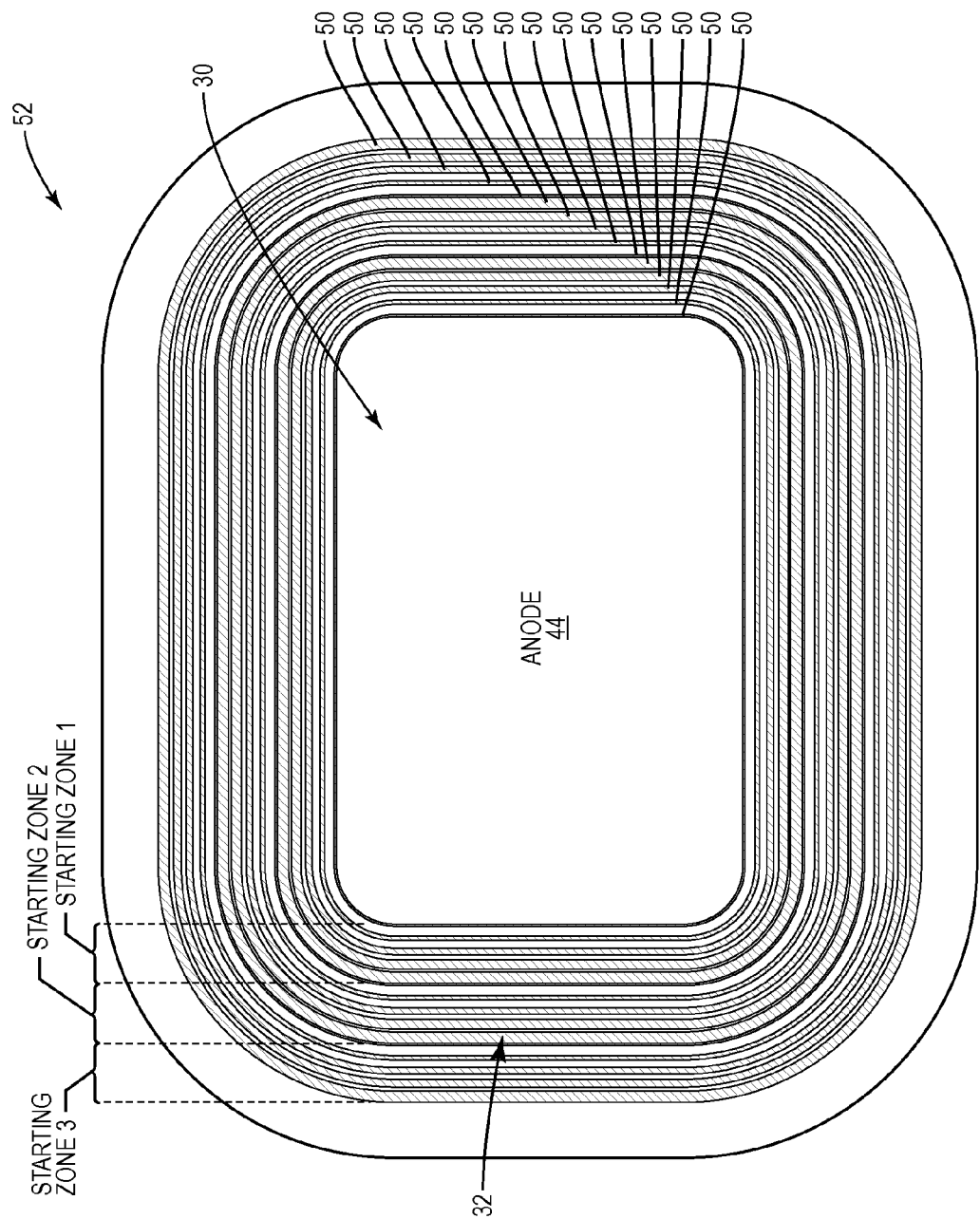
Figure 7:
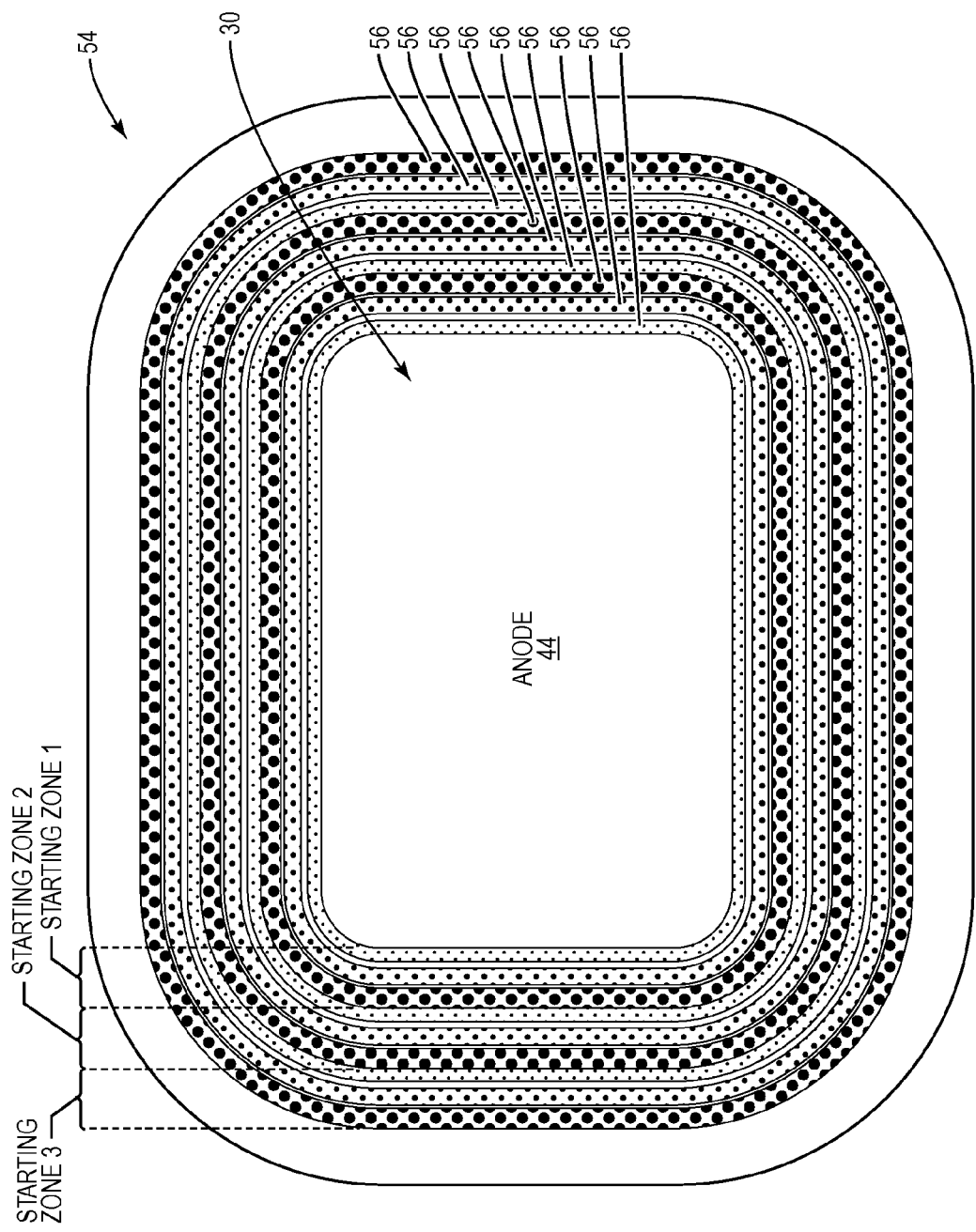
Figure 8:
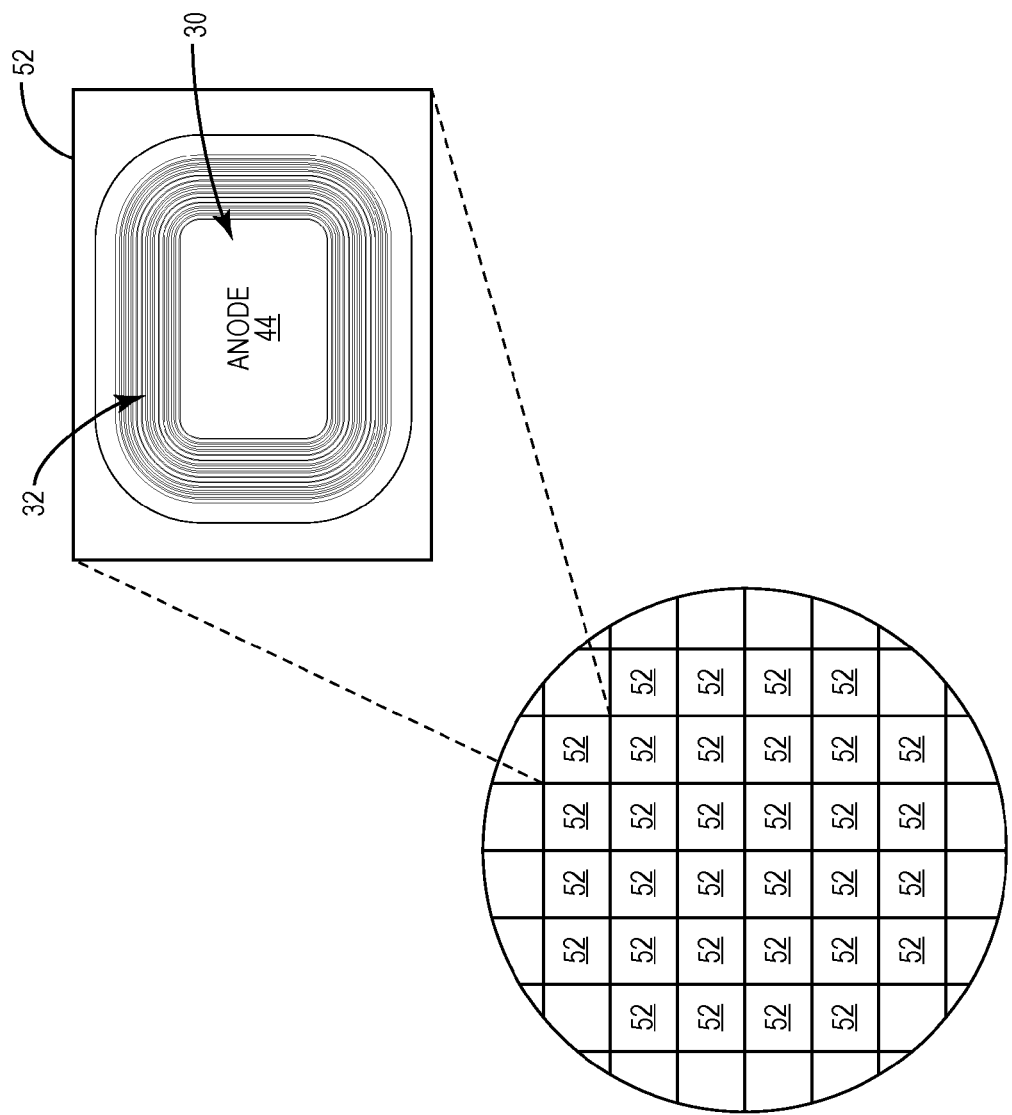
Figure 9A:
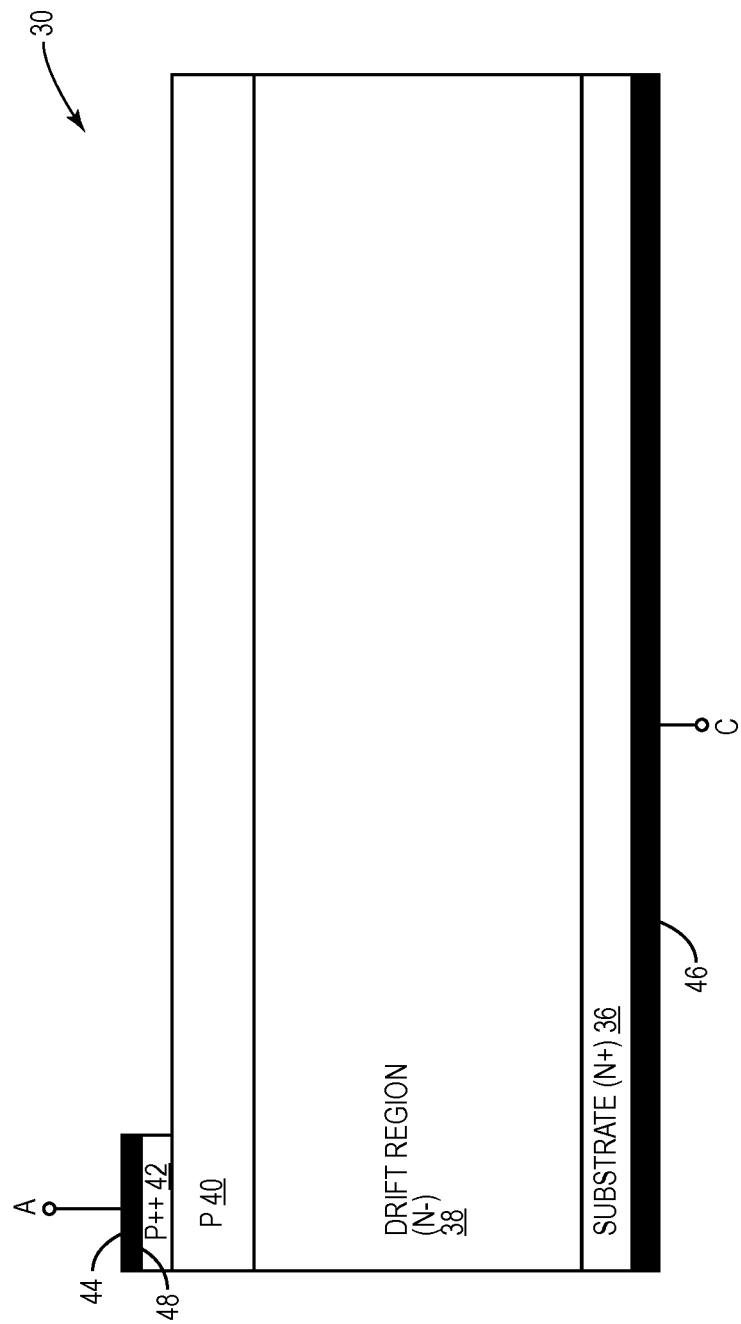
Figure 9B:
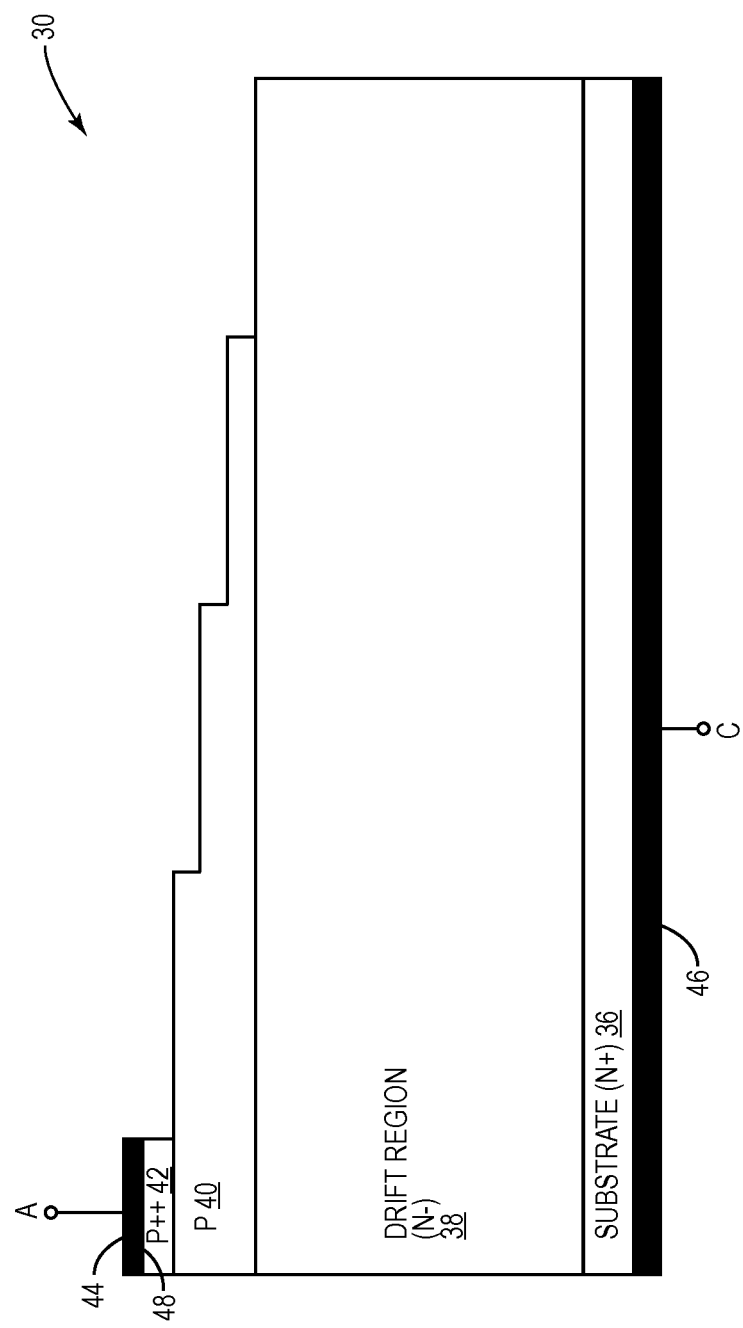
Figure 9C:
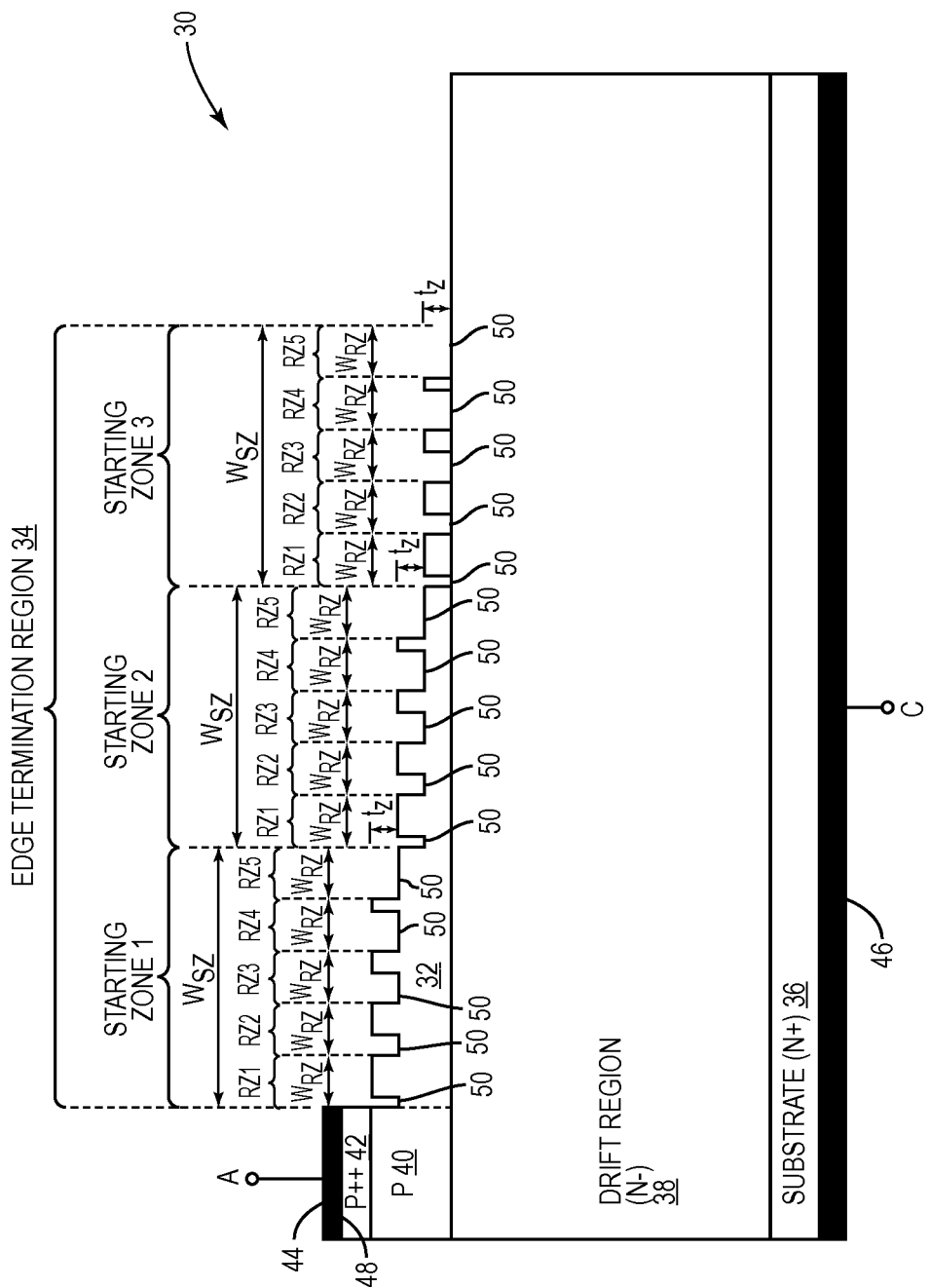

FIG. 4 illustrates an edge termination structure for a semiconductor device that includes a number of negative steps that define multiple concentric starting zones in a corresponding edge termination region around a periphery of the semiconductor device, where the edge termination structure includes, in each starting zone, negative features that approximate a desired dose profile from an edge of a main junction of the semiconductor device and an edge of the edge termination region according to one embodiment of the present disclosure;

FIGS. 5A through 5C graphically illustrate one example of an electric field in an edge termination region of a semiconductor device for the traditional three-step etched edge termination structure of FIG. 1, the state-of-the-art stepped negative bevel edge termination structure of FIG. 3, and the edge termination structure of FIG. 4 according to one embodiment of the present disclosure;

FIG. 6 illustrates a semiconductor die including a semiconductor device and the edge termination structure of FIG. 4 around a periphery of the semiconductor device according to one embodiment of the present disclosure in which negative features included in each zone of the edge termination region are trenches;

FIG. 7 illustrates a semiconductor die including a semiconductor device and the edge termination structure of FIG. 4 around a periphery of the semiconductor device according to one embodiment of the present disclosure in which negative features included in each zone of the edge termination region are divots;

FIG. 8 illustrates a semiconductor wafer on which semiconductor devices and corresponding edge termination structures are fabricated according to one embodiment of the present disclosure; and FIGS. 9A through 9C graphically illustrate a process for fabricating a semiconductor device and an edge termination structure around the periphery of the semiconductor device in one of the semiconductor die regions of the semiconductor wafer of FIG. 8 according to one embodiment of the present disclosure.

DETAILED DESCRIPTION

The embodiments set forth below represent the necessary information to enable those skilled in the art to practice the embodiments and illustrate the best mode of practicing the embodiments. Upon reading the following description in light of the accompanying drawing figures, those skilled in the art will understand the concepts of the disclosure and will recognize applications of these concepts not particularly addressed herein. It should be understood that these concepts and applications fall within the scope of the disclosure and the accompanying claims.

It will be understood that, although the terms first, second, etc. may be used herein to describe various elements, these elements should not be limited by these terms. These terms are only used to distinguish one element from another. For example, a first element could be termed a second element, and, similarly, a second element could be termed a first element, without departing from the scope of the present disclosure. As used herein, the term "and/or" includes any and all combinations of one or more of the associated listed items.

It will be understood that when an element such as a layer, region, or substrate is referred to as being "on" or extending "onto" another element, it can be directly on or extend directly onto the other element or intervening elements may also be present. In contrast, when an element is referred to as being "directly on" or extending "directly onto" another element, there are no intervening elements present. Likewise, it will be understood that when an element such as a layer, region, or substrate is referred to as being "over" or extending "over" another element, it can be directly over or extend directly over the other element or intervening elements may also be present. In contrast, when an element is referred to as being "directly over" or extending "directly over" another element, there are no intervening elements present. It will also be understood that when an element is referred to as being "connected" or "coupled" to another element, it can be directly connected or coupled to the other element or intervening elements may be present. In contrast, when an element is referred to as being "directly connected" or "directly coupled" to another element, there are no intervening elements present.

Relative terms such as "below" or "above" or "upper" or "lower" or "horizontal" or "vertical" may be used herein to describe a relationship of one element, layer, or region to another element, layer, or region as illustrated in the Figures. It will be understood that these terms and those discussed above are intended to encompass different orientations of the device in addition to the orientation depicted in the Figures.

The terminology used herein is for the purpose of describing particular embodiments only and is not intended to be limiting of the disclosure. As used herein, the singular forms "a," "an," and "the" are intended to include the plural forms as well, unless the context clearly indicates otherwise. It will be further understood that the terms "comprises," "comprising," "includes," and/or "including" when used herein specify the presence of stated features, integers, steps, operations, elements, and/or components, but do not preclude the presence or addition of one or more other features, integers, steps, operations, elements, components, and/or groups thereof.

Unless otherwise defined, all terms (including technical and scientific terms) used herein have the same meaning as commonly understood by one of ordinary skill in the art to which this disclosure belongs. It will be further understood that terms used herein should be interpreted as having a meaning that is consistent with their meaning in the context of this specification and the relevant art and will not be interpreted in an idealized or overly formal sense unless expressly so defined herein.

Embodiments of a semiconductor die having a semiconductor device implemented on the semiconductor die and an edge termination structure around a periphery of the semiconductor device and methods of fabricating the same are disclosed. In one embodiment, a semiconductor die includes a semiconductor device and an edge termination structure around a periphery of the semiconductor device, where the edge termination structure includes negative features (e.g., trenches and/or divots) that vary dose in a corresponding edge termination region to approximate a desired dose profile. In one embodiment, the desired dose profile is a substantially decreasing or substantially linearly decreasing dose from an edge of a main junction of the semiconductor device to an edge of the edge termination region. In this manner, electric field crowding at the edge of the main junction of the semiconductor device is substantially reduced, which in turn substantially improves a break-down voltage of the semiconductor device.

Figure 2A:
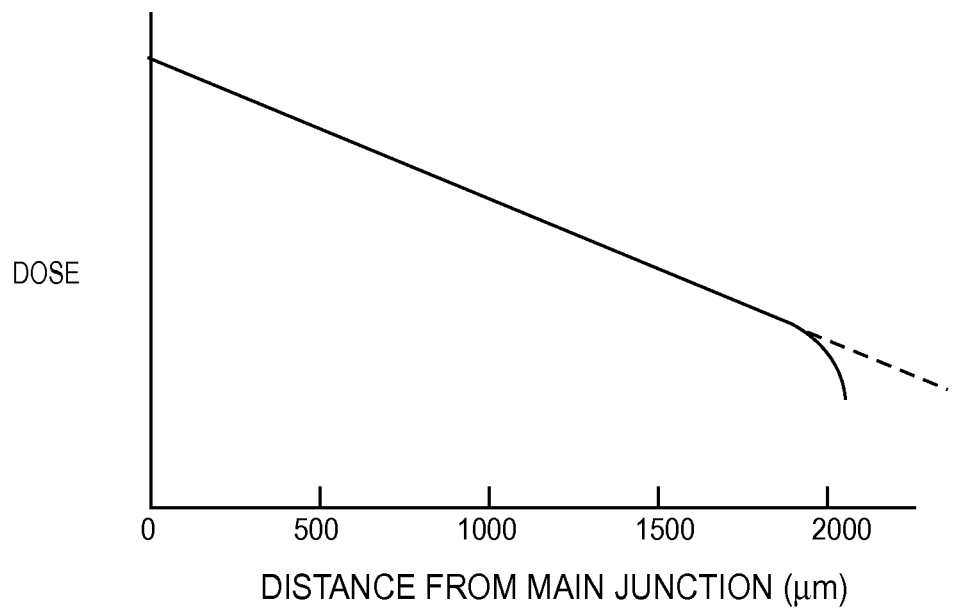
FIGS. 2A and 2B illustrate a desired dose profile and corresponding electric field profiles for an edge termination structure according to one embodiment of the present disclosure.

Before discussing embodiments of the edge termination structure of the present disclosure, a discussion of one example of a preferred dose profile and corresponding electric field profiles as well as a discussion of a state-of-the-art edge termination structure that approximates the preferred dosing profile are provided. In this regard, FIG. 2A illustrates one example of a preferred dose profile that reduces electric field crowding at an edge of a main junction of a semiconductor device. As illustrated, the preferred dose profile substantially linearly decreases from the edge of the main junction toward an edge of the edge termination structure (i.e., to an edge of a corresponding edge termination region). As indicated by the dashed line, in some implementations, the preferred dose profile is approximated as a linearly decreasing dose profile when the preferred dose profile in fact is not completely linear. In this example, the preferred dose profile has a non-linear tail which may be desirable to, for example, compensate for 2D effects in the drift region of a semiconductor device caused by the use of a heavily doped drift region, such as that used in a symmetric blocking structure.

Note that the desired dose profile of FIG. 2A is only one example. The embodiments of the edge termination structure and methods of fabrication thereof disclosed herein can be utilized to provide any desired dose profile. The desired dose profile is preferably a decreasing or substantially decreasing dose profile, but is not limited thereto. Further, some non-limiting examples of a substantially decreasing dose profile is a dose profile that is in a sine wave shape with a decreasing magnitude, a linearly decreasing dose profile with one or more bumps (e.g., a bump in magnitude at the edge of the termination region), or a curve having a negative slope (e.g., the desired dose profile is equal to $-x^3$ for $x \geq 0$ where x represents distance from the main junction toward the edge of the edge termination region).

The equation that governs electric fields is Poisson's equation, which states:

$$\nabla^2 V = \frac{\partial^2 V}{\partial x^2} + \frac{\partial^2 V}{\partial y^2} + \frac{\partial^2 V}{\partial z^2} = -\frac{\rho}{\varepsilon}, \quad \text{Eqn. (1)}$$

where $\rho$ is the volume density of free charges (which may be a function of space coordinate) and $\in$ is the permittivity of the medium. For semiconductor analysis, Poisson's equation can be written as:

$$\nabla \cdot E = \frac{dE}{dx} + \frac{dE}{dy} + \frac{dE}{dz} = \frac{\rho}{K_S \varepsilon_0} \quad \text{Eqn. (2)}$$

where $$\rho = q(p - n + N_D - N_A), \text{ and} \quad \text{Eqn. (3)}$$

$K_S$ is the semiconductor dielectric constant and $\in_0$ is the permittivity of free space ($K_S \in_0 = \in$). From Equations (2) and (3), it can be seen that electric field crowding can be reduced by reducing the dose (i.e., doping concentration×height) near the edge of the main junction of a semiconductor device.

Figure 2B:
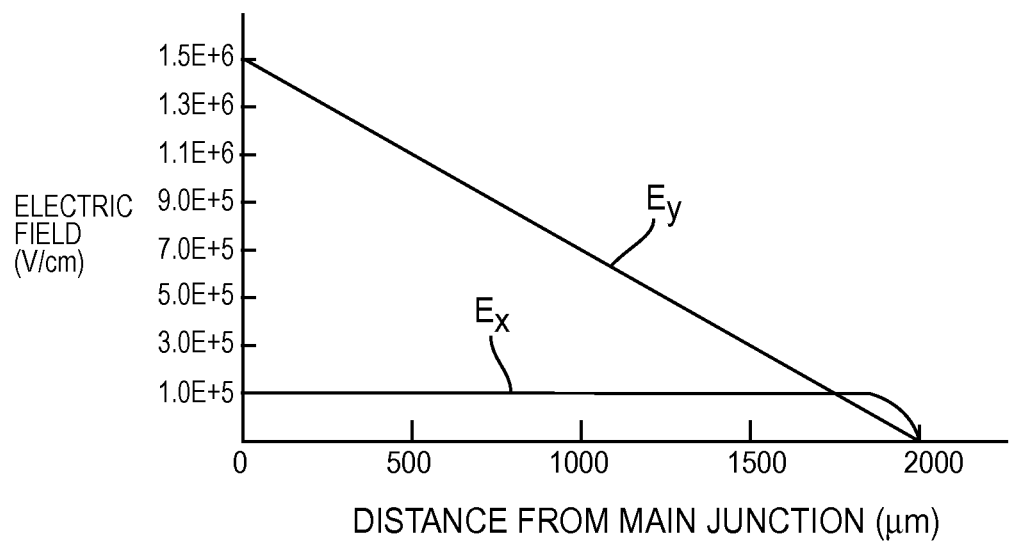

In order to illustrate the reduced field crowding resulting from the preferred dose profile of FIG. 2A, FIG. 2B illustrates electric field profiles corresponding to one example of a semiconductor device having an edge termination structure that provides the preferred dose profile of FIG. 2A. As illustrated, when under reverse bias, a vertical, or y, component ($E_y$) of the electric field linearly decreases with increasing distance from the main junction according to the preferred dose profile. As a result, electric field crowding at the edge of the main junction of the semiconductor device is reduced as compared to the same semiconductor device with no edge termination structure. In addition, a lateral, or x, component ($E_x$) of the electric field is relatively small or, in other words, the lateral component ($E_x$) of the electric field is effectively spread over the edge termination region.

FIG. 3 illustrates a semiconductor device 10 and a state-of-the-art edge termination structure 12 (hereinafter referred to as a multi-step negative bevel edge termination structure 12) that approximates a substantially linearly decreasing dose profile formed around a periphery of the semiconductor device 10 in a corresponding edge termination region 14. Due to the difficultly in etching a smooth slope in Silicon Carbide (SiC), the multi-step negative bevel edge termination structure 12 is particularly beneficial for SiC semiconductor devices. In this example, the semiconductor device 10 is a PiN diode and includes a highly doped N type (N+) substrate 16, a lightly doped N type (N−) drift region 18 on the substrate 16, a P type layer 20 on the drift region 18 opposite the substrate 16 and in which the multi-step negative bevel edge termination structure 12 is formed, and a very highly doped P type (P++) anode region 22 on the P type layer 20 opposite the drift region 18. The semiconductor device 10 also includes an anode contact 24 on the anode region 22 opposite the P type layer 20 and a cathode contact 26 on a backside of the substrate 16 opposite the drift region 18.

The multi-step negative bevel edge termination structure 12 approximates a smooth slope. More specifically, the multi-step negative bevel edge termination structure 12 includes a number of steps, or more particularly negative steps, that define corresponding zones (ZONE 1 through ZONE 7) in the edge termination region 14. While seven zones are illustrated in this example, the multi-step negative bevel edge termination structure 12 may include any number of zones created by a corresponding number of negative steps. However, the number of negative steps is preferably greater than three and even more preferably substantially greater than three. As used herein, the term "negative step" is used to clearly indicate that the steps of the multi-step negative bevel edge termination structure 12 step downward or into the P type layer 20. For more information regarding the multi-step negative bevel edge termination structure 12, the interested reader is directed to U.S. Patent Application Publication No. 2012/0292636, entitled SIC DEVICES WITH HIGH BLOCKING VOLTAGE TERMINATED BY A NEGATIVE BEVEL, which is hereby incorporated herein by reference in its entirety. The multi-step negative bevel edge termination structure 12 effectively decreases the dose of the P type layer 20 in the edge termination region 14 to provide a dose profile that approximates the preferred dose profile of FIG. 2A. In doing so, electric field crowding at an edge of a main junction 28 is substantially reduced and, as a result, a breakdown voltage of the semiconductor device 10 is substantially increased. In addition, since there are many negative steps with small step sizes (i.e., step heights that correspond to etch depths), peaks in the lateral, or x, component of the electric field that are present in the traditional three-step edge termination structure are reduced if not eliminated.

One issue with the multi-step negative bevel edge termination structure 12 is that the negative steps require multiple etch masks (i.e., multiple etching steps) and precise control of an etch depth ($t_z$) used to create the negative steps in the multi-step negative bevel edge termination structure 12. As the number of steps increase for a given thickness of the P type layer 20, in addition to requiring multiple etch masks, the requisite accuracy and precision of the etch depth ($t_z$) becomes difficult to achieve. As discussed below, the edge termination structure disclosed herein is highly flexible and, in one embodiment, provides performance that is similar to the multi-step negative bevel edge termination structure 12 using fewer steps while also relaxing the requirements for the accuracy and precision of the etch depth ($t_z$).

In this regard, FIG. 4 illustrates a semiconductor device 30 and an edge termination structure 32 around a periphery of the semiconductor device 30 in a corresponding edge termination region 34 according to one embodiment of the present disclosure. In this example, the semiconductor device 30 is a PiN diode and includes an N+ substrate 36, an N− drift region 38 on the substrate 36, a P type layer 40 on the drift region 38 opposite the substrate 36 and in which the edge termination structure 32 is formed, and a P++ anode region 42 on the P type layer 40 opposite the drift region 38. As used herein, a lightly doped layer/region (e.g., the N− drift region 38) is a layer/region having a doping concentration in a range of and including $1 \times 10^{13}$ to $1 \times 10^{16}$ cm$^{-3}$ (or less), a highly doped layer/region (e.g., the N+ substrate 36) is a layer/region having a doping concentration in a range of and including $5 \times 10^{17}$ to $1 \times 10^{20}$ cm$^{-3}$, and a very highly doped layer/region (e.g., the P++ anode region 42) is a layer/region having a doping concentration greater than $5 \times 10^{17}$ cm$^{-3}$. The semiconductor device 30 also includes an anode contact 44 on the anode region 42 opposite the P type layer 40 and a cathode contact 46 on a backside of the substrate 36 opposite the drift region 38.

Note that the PiN diode of FIG. 4 is only one example of a semiconductor device with which the edge termination structure 32 can be used. The edge termination structure 32 can be used with any suitable semiconductor device. Preferably, the semiconductor device 30 is a vertical semiconductor device and, more preferably a vertical high voltage power semiconductor device, and even more preferably a vertical high voltage power SiC semiconductor device. As used herein, a high voltage power semiconductor device is a semiconductor device with a reverse breakdown voltage greater than 3 kilovolts (kV) and up to or even greater than 20 kV. For example, the semiconductor device 30 may be any type of power semiconductor device, especially one that incorporates a mesa structure, such as a thyristor (e.g., a Gate Turn-On Thyristor (GTO) or a Metal Oxide Semiconductor Turn-Off Thyristor (MTO)), a trench Insulated Gate Bipolar Transistor (IGBT), a PiN diode, a Bipolar Junction Transistor (BJT), and a trench Junction Barrier Schottky (JBS) diode. In addition, the edge termination structure 32 can be used for either N-type or P-type semiconductor devices, where the edge termination structure 32 is formed in a layer having a doping type that is opposite that of the drift region of the semiconductor device.

In this embodiment, the edge termination structure 32 approximates a desired dose profile from an edge of a main junction 48 of the semiconductor device 30 to an edge of the edge termination region 34 using a combination of negative steps and negative features (e.g., trenches and/or divots) within zones created by the negative steps (referred to herein as "starting zones") to vary an effective dose of the P type layer 40 in the edge termination region 34 according to the desired dose profile. Note that while dose is used in this description, it should be appreciated that the edge termination structure 32 likewise varies charge to achieve a desired charge profile that substantially corresponds to the desired dose profile. More specifically, the edge termination structure 32 includes a number of negative steps formed in the P type layer 40 around the periphery of the semiconductor device 30. The negative steps define concentric starting zones (STARTING ZONE 1 through STARTING ZONE 3) within the edge termination region 34 around the periphery of the semiconductor device 30. The negative steps have heights that correspond to a desired etch depth ($t_z$). While the etch depth is the same for all of the starting zones (STARTING ZONE 1 through STARTING ZONE 3) in this example, different etch depths may be used for the negative steps if desired. Further, while there are three starting zones (STARTING ZONE 1 through STARTING ZONE 3) and a corresponding number of negative steps in this example, it should be appreciated that there may be any number of negative steps and corresponding starting zones. In one embodiment, there is at least one negative step that defines at least two starting zones. However, in an alternative embodiment, there are no negative steps (i.e., there is only one starting zone that, in one embodiment, corresponds to the entire edge termination region 34).

The starting zones (STARTING ZONE 1 through STARTING ZONE 3) have corresponding widths ($W_{SZ}$). In this example, each of the starting zones (STARTING ZONE 1 through STARTING ZONE 3) has the same width ($W_{SZ}$). However, in one alternative embodiment, the widths ($W_{SZ}$) of the starting zones (STARTING ZONE 1 through STARTING ZONE 3) vary. For instance, at least two of the starting zones (STARTING ZONE 1 through STARTING ZONE 3) may have different widths ($W_{SZ}$). Thus, in general, each of the starting zones (STARTING ZONE 1 through STARTING ZONE 3) may have any desired width ($W_{SZ}$).

Within each of the starting zones (STARTING ZONE 1 through STARTING ZONE 3), negative features, which in this example are trenches 50, form concentric rings around the periphery of the semiconductor device 30. While trenches 50 are illustrated in this embodiment, as discussed below, any desired type of negative features may be used. As used herein, a negative feature is any type of etched feature such as, but not limited to, a trench or divot. Further, a trench is a continuous cut-line. In contrast, a divot is a hole etched into the surface of the semiconductor material having a desired shape (e.g., circular divot, square divot, or the like). The trenches 50 may also be referred to herein as trench rings around the periphery of the semiconductor device 30. The trenches 50 define corresponding ring zones (RZs), where each ring zone (RZ) is defined as a zone from a starting edge of a corresponding trench 50 to a starting edge of the next trench 50. While each of the starting zones (STARTING ZONE 1 through STARTING ZONE 3) includes five ring zones (RZ 1 through RZ 5) in this example, there may be any number of two or more ring zones (RZs) within each of the starting zones (STARTING ZONE 1 through STARTING ZONE 3). Further, the starting zones (STARTING ZONE 1 through STARTING ZONE 3) may have the same or different numbers of rings zones (RZs). Widths ($W_{RZ}$) of the ring zones (RZs) are preferably but not necessarily equal.

Widths of the trenches 50 vary within the ring zones (RZs) of each of the starting zones (STARTING ZONE 1 through STARTING ZONE 3) such that the dose, or effective dose, of the P type layer 40 is varied according to the desired dose profile. The widths of the trenches 50 can vary from a lower limit imposed by the resolution of the etching process up to the width ($W_{SZ}$) of the corresponding starting zone depending on the desired dose profile. In this embodiment, the desired dose profile is a linearly decreasing or substantially linearly decreasing dose from the edge of the main junction 48 of the semiconductor device 30 to the edge of the edge termination region 34. As such, looking first at the first starting zone (STARTING ZONE 1), the width of the trench 50 in ring zone 1 (RZ 1) is less than the width of the trench 50 in ring zone 2 (RZ 2), which is less than the width of the trench 50 in ring zone 3 (RZ 3), and so on. As a result, the dose of the P type layer 40 in ring zone 1 (RZ 1) is greater than the dose of the P type layer 40 in ring zone 2 (RZ 2), which is greater than the dose of the P type layer 40 in ring zone 3 (RZ 3), and so on. In this manner, the dose of the P type layer 40 decreases throughout the first starting zone (STARTING ZONE 1).

Then, looking at the second starting zone (STARTING ZONE 2), the negative step between the first starting zone (STARTING ZONE 1) and the second starting zone (STARTING ZONE 2) reduces the dose of the P type layer 40 in the second starting zone (STARTING ZONE 2) relative to that in the first starting zone (STARTING ZONE 1). As such, in order to maintain the linearly decreasing or substantially linearly decreasing dose profile, the width of the first trench 50 in the second starting zone (STARTING ZONE 2) is less than that of the last trench 50 in the first starting zone (STARTING ZONE 1). The widths of the trenches 50 in the second starting zone (STARTING ZONE 2) again increase throughout the second starting zone (STARTING ZONE 2) to continue the linear decrease or substantially linear decrease in dose. The widths of the trenches 50 in the remaining starting zone (STARTING ZONE 3) are selected in a similar manner. Thus, the widths of the trenches 50 in the starting zones (STARTING ZONE 1 through STARTING ZONE 3) are selected or designed to approximate the desired linearly decreasing or substantially linearly decreasing dose profile. Note that while the desired dose profile in the embodiment of FIG. 4 is a linearly decreasing or substantially linearly decreasing dose, the edge termination structure 32 is not limited thereto. The widths of the trenches 50 may be varied to provide any desired dose profile.

The edge termination structure 32 provides numerous advantages over the multi-step negative bevel edge termination structure 12 of FIG. 3. While not being limited to or by any particular advantage, some examples are provided. As a first example, the edge termination structure 32 can be formed using only a single etch mask in addition to the etch mask(s) required for forming the negative steps. As another example, the etch depth of the trenches 50, or other negative features, in the starting zones (STARTING ZONE 1 through STARTING ZONE 3) of the edge termination structure 32 do not need to be as accurately and precisely controlled as those in the multi-step negative bevel edge termination structure 12 having many negative steps (e.g., larger etch depths can be used). As yet another example, the edge termination structure 32 leverages the fine resolution provided by current photolithographic techniques to form the trenches 50 (or other negative features) in the starting zones (STARTING ZONE 1 through STARTING ZONE 3). As another example, the dose profile, or corresponding charge profile, provided by the edge termination structure 32 can be made linear to an arbitrary resolution limited only by photolithographic equipment without increased process complexity or process steps. This is in contrast to the multi-step negative bevel edge termination structure 12, which requires additional etch steps and additional control of etch depth to increase resolution (i.e., to increase the number of etch steps and decrease the etch depth for each step).

FIGS. 5A through 5C graphically illustrate vertical, or y, components and lateral, or x components, of the electric field (E) for one example of the traditional etch Junction Termination Extension (JTE) of FIG. 1, one example of the multi-step negative bevel edge termination structure 12 of FIG. 3, and one example of the edge termination structure 32 of FIG. 4, respectively. As illustrated in FIG. 5A, the vertical, or y, component ($E_y$) of the electric field for the three-step etched JTE of FIG. 1 has a profile that substantially follows the shape of the three-step JTE. As a result, there is still a substantial amount of electric field crowding near the main junction of the semiconductor device (i.e., the magnitude of $E_y$ near the edge of the main junction is high). In addition, the sharp changes in dose at the locations of the negative steps results in corresponding peaks in the lateral, or x, component ($E_x$) of the electric field, which like electric field crowding is undesirable.

In contrast, as illustrated in FIG. 5B, the multi-step negative bevel edge termination structure 12 provides a good approximation of a linearly decreasing dose profile, which in turn results in a substantially linearly decreasing vertical, or y, component ($E_y$) of the electric field. As such, electric field crowding at the edge of the main junction 28 is substantially reduced. In addition, because the multi-step negative bevel edge termination structure 12 does not include the large changes in dose found in the three-step JTE of FIG. 1, the lateral, or x, component ($E_x$) of the electric field does not include peaks or, in other words, the multi-step negative bevel edge termination structure 12 provides good lateral spreading of the lateral, or x, component ($E_x$) of the electric field over the edge termination region 14.

As illustrated in FIG. 5C, the edge termination structure 32 of FIG. 4 performs similarly to the multi-step negative bevel edge termination structure 12. More specifically, the edge termination structure 32 provides a substantially linearly decreasing dose profile (or more precisely is a good approximation of a linearly decreasing or substantially linearly decreasing dose profile), which in turn results in a substantially linearly decreasing vertical, or y, component ($E_y$) of the electric field. As such, electric field crowding at the edge of the main junction 48 is substantially reduced. In addition, because the edge termination structure 32 does not include the large changes in dose found in the three-step JTE of FIG. 1, the lateral, or x, component ($E_x$) of the electric field does not include peaks or, in other words, the edge termination structure 32 provides good lateral spreading of the lateral, or x, component ($E_x$) of the electric field over the edge termination region 34.

FIG. 6 is a top-down view of a semiconductor die 52 including the semiconductor device 30 and the edge termination structure 32 of FIG. 4 according to one embodiment of the present disclosure. As illustrated, the edge termination structure 32 extends around a periphery of the semiconductor device 30. As discussed above, the edge termination structure 32 includes the trenches 50 in the ring zones (RZs) in each of the starting zones (STARTING ZONE 1 through STARTING ZONE 3).

As discussed above, the edge termination structure 32 is not limited to using the trenches 50 but may use any type or combination of types of negative features (e.g., trenches and/or divots). In this regard, FIG. 7 is a top down view of a semiconductor die 54 including the semiconductor device 30 and an alternative embodiment of the edge termination structure 32 in which the trenches 50 are replaced with divot rings 56. Note that, in this example, there are three divot rings 56 per starting zone. However, there may be any number of one or more, or preferably two or more, divot rings 56 per starting zone. Each divot ring 56 includes a number of divots forming a ring of divots around the periphery of the semiconductor device 30 in a corresponding ring zone (RZ). The widths of the divot rings 56 are varied to provide the desired dose profile. In addition or as an alternative to varying the widths of the divot rings 56, widths of the divots in the divot rings 56 and/or density of the divots in the divot rings 56 may be varied to provide the desired dose profile. The divots used to form the divot rings 56 can be of any desired shape (e.g., circles, squares, rectangles, triangles, or the like). Further, in one embodiment, the divots in the divot rings 56 are all the same size. In another embodiment, the divots in the divot rings 56 may have different sizes. For example, divots in a divot ring 56 having a larger ring width may be larger that divots in a divot ring 56 having smaller ring width.

FIGS. 8 and 9A through 9C graphically illustrate a process for fabricating a semiconductor die including the semiconductor device 30 and the edge termination structure 32 according to one embodiment of the present disclosure. Specifically, FIG. 8 illustrates a semiconductor wafer 58 that that is processed and diced to provide a number of the semiconductor dies 52 of FIG. 6. Note, however, that the semiconductor wafer 58 may alternatively be processed and diced to provide a number of the semiconductor dies 54 of FIG. 7. The regions of the semiconductor wafer 58 that correspond to the semiconductor dies 52 after dicing are referred to herein as semiconductor die regions.

FIGS. 9A through 9C illustrate the processing of the semiconductor wafer 58 with respect to one of the semiconductor dies 52 according to one embodiment of the present disclosure. More specifically, FIGS. 9A through 9C illustrate processing of the semiconductor wafer 58 to form the semiconductor device 30 and the edge termination structure 32 around the periphery of the semiconductor device 30 within a corresponding semiconductor die region of the semiconductor wafer 58. First, as illustrated in FIG. 9A, the semiconductor device 30 is formed using appropriate processing steps. Next, as illustrated in FIG. 9B, the negative steps defining the starting zones (STARTINGS ZONE 1 through STARTING ZONE 3) are etched into the surface of the P type layer 40 in the edge termination region 34. Lastly, the trenches 50 are etched into the P type layer 40 in the ring zones (RZs) in each of the starting zones (STARTING ZONE 1 through STARTING ZONE 3), as illustrated in FIG. 9C.

Lastly, while the embodiments disclosed herein utilize negative features (i.e., trenches and/or divots) in the starting zones of the edge termination region 34, the present disclosure is not limited thereto. In one alternative embodiment, the negative features in one or more and possibly all of the starting zones are replaced with implant regions. In another alternative embodiment, implant regions may be used in addition to the negative features in one or more and possibly all of the starting zones.

Those skilled in the art will recognize improvements and modifications to the preferred embodiments of the present disclosure. All such improvements and modifications are considered within the scope of the concepts disclosed herein and the claims that follow.

What is claimed is:

1. A semiconductor die, comprising:
a semiconductor device; and
an edge termination structure in an edge termination region around a periphery of the semiconductor device, the edge termination structure comprising at least two negative features having at least two divot rings around the periphery of the semiconductor device wherein the at least two divot rings have increasing widths thereby providing a decreasing dose moving laterally toward an edge of the edge termination region.

2. The semiconductor die of claim 1 wherein the increasing widths of the divots approximate a desired dose profile from an edge of a main junction of the semiconductor device to the edge of the edge termination region.

3. A semiconductor die, comprising:
a semiconductor device; and
an edge termination structure in an edge termination region around a periphery of the semiconductor device, the edge termination structure approximating a desired dose profile from an edge of a main junction of the semiconductor device to an edge of the edge termination region and comprising:
one or more negative steps that define at least two concentric starting zones within the edge termination region; and
for each zone of the at least two concentric starting zones, at least two negative features in the zone that vary dose within the zone according to the desired dose profile, wherein, for at least one zone of the at least two concentric starting zones, the at least two negative features in the at least one zone comprise at least two trenches having increasing widths to thereby provide a decreasing dose moving laterally away from the edge of the main junction of the semiconductor device toward the edge of the edge termination region.

4. The semiconductor die of claim 3 wherein the desired dose profile is a linearly decreasing dose from the edge of the main junction of the semiconductor device to the edge of the edge termination region.

5. A semiconductor die, comprising:
a semiconductor device; and
an edge termination structure in an edge termination region around a periphery of the semiconductor device, the edge termination structure approximating a desired dose profile from an edge of a main junction of the semiconductor device to an edge of the edge termination region and comprising:
one or more negative steps that define at least two concentric starting zones within the edge termination region; and
for each zone of the at least two concentric starting zones, at least two negative features in the zone that vary dose within the zone according to the desired dose profile, wherein, for at least one zone of the at least two concentric starting zones, the at least two negative features in the at least one zone comprise at least two divot rings having increasing widths to thereby provide a decreasing dose moving laterally away from the edge of the main junction of the semiconductor device toward the edge of the edge termination region.

6. The semiconductor die of claim 5 wherein, for each zone of the at least one zone, divots within a divot ring of the at least two divot rings in the zone are all the same size, and a number of divots in each divot ring of the at least two divot rings in the zone is a function of the width of the divot ring.

7. The semiconductor die of claim 5 wherein, for each zone of the at least one zone, divots within different rings of the at least two divot rings in the zone are of varying sizes such that the sizes of the divots increase as the widths of the at least two divot rings increase.

8. The semiconductor die of claim 3 further comprising:
a first layer of a first doping type; and
a second layer of a second doping type;
wherein the semiconductor device comprises a first contact on a surface of the first layer opposite the second layer and a second contact on a surface of the second layer opposite the first layer, and the edge termination structure is formed in the second layer.

9. The semiconductor die of claim 3 wherein the semiconductor device is a vertical device.

10. The semiconductor die of claim 9 wherein the semiconductor device is a power device.

11. The semiconductor device of claim 10 wherein the semiconductor device is one of a group consisting of: a thyristor, a trench Insulated Gate Bipolar Transistor (trench-IGBT), a PiN diode, a Bipolar Junction Transistor (BJT), and a trench Junction Barrier Schottky (JBS) diode.

12. A method comprising:
forming a semiconductor device in a semiconductor die area of a semiconductor wafer; and
forming an edge termination structure around a periphery of the semiconductor device in an edge termination region within the semiconductor die area such that the edge termination structure approximates a desired dose profile from an edge of a main junction of the semiconductor device to an edge of the edge termination region;
wherein forming the edge termination structure comprises:
providing one or more negative steps in the edge termination region that define at least two concentric starting zones within the edge termination region; and
for each zone of the at least two concentric starting zones, providing at least two negative features in the zone that vary dose within the zone according to the desired dose profile wherein, for at least one zone of the at least two concentric starting zones, the at least two negative features in the at least one zone comprise at least two trenches having increasing widths to thereby provide a decreasing dose moving laterally away from the edge of the main junction of the semiconductor device toward the edge of the edge termination region.

13. The method of claim 12 wherein forming the edge termination structure comprises forming the edge termination structure such that the desired dose profile approximated by the edge termination structure is any desired dose profile.

14. The method of claim 12 wherein the desired dose profile is a substantially linearly decreasing dose from the edge of the main junction of the semiconductor device to the edge of the edge termination region.

* * * * *